United States Patent
Hanners et al.

[11] Patent Number: 5,986,447
[45] Date of Patent: Nov. 16, 1999

[54] TEST HEAD STRUCTURE FOR INTEGRATED CIRCUIT TESTER

[75] Inventors: John C. Hanners, Brentwood; Charles A. Miller; Dean Stanford, both of Fremont, all of Calif.

[73] Assignee: Credence Systems Corporation, Fremont, Calif.

[21] Appl. No.: 09/039,738

[22] Filed: Mar. 16, 1998

Related U.S. Application Data

[63] Continuation-in-part of application No. 08/862,596, May 23, 1997.

[51] Int. Cl.[6] .................................................. G01R 31/02
[52] U.S. Cl. ........................................ 324/158.1; 324/754
[58] Field of Search .................................... 324/754, 755, 324/757, 758, 765, 158.1

[56] References Cited

U.S. PATENT DOCUMENTS

| | | | |
|---|---|---|---|
| 4,517,512 | 5/1985 | Petrich et al. | 324/754 |
| 5,747,994 | 5/1998 | Suga | 324/158.1 |

*Primary Examiner*—Josie Ballato
*Assistant Examiner*—Russell M. Kobert
*Attorney, Agent, or Firm*—Smith-Hill and Bedell

[57] ABSTRACT

A test head for an integrated circuit-tester includes a horizontal base holding a circular motherboard. The motherboard distributes input test instructions to an array of carrier boards mounted thereon, the carrier boards being radially distributed about a central vertical axis of the motherboard. Each carrier board holds a set of daughterboards, and each daughterboard holds a set of node cards. The carrier boards and daughterboards include data paths for forwarding the test instructions from the motherboard to the node cards. Each node card contains circuits for transmitting test signals to and receiving response signals from a separate terminal of a device under test (DUT) in response to the test instructions forwarded thereto. Edges of the carrier boards extend downward through apertures in the base to contact pads on an interface board holding the DUT. The carrier boards and daughterboards provide conductive paths for the test and response signals extending between the node cards and pads on the DUT interface board. The interface board extends those conductive paths from the pads to terminals of the DUT.

25 Claims, 6 Drawing Sheets

TEST HEAD STRUCTURE FOR INTEGRATED CIRCUIT TESTER

CROSS-REFERENCE TO RELATED APPLICATIONS

The present application is a continuation-in-part of copending application Ser. No. 08/862,596, filed May 23, 1997, now pending, incorporated herein by reference.

BACKGROUND OF THE INVENTION

1. Field of the Invention

The present invention relates in general to equipment for automatically testing electronic circuits and in particular to a test head structure for holding components of a per-pin integrated circuit tester.

2. Description of Related Art

An integrated circuit tester applies patterns of logic signals to input terminals of an integrated circuit (IC) and acquires the resulting logic signal patterns produced at its output terminals. Testers typically include a separate "pin electronics" circuit for each IC terminal. During each cycle of a test, a pin electronics circuit can, for example, send a high or low logic level test signal to the pin, sample an IC output signal at the pin and store data indicating its logic level, or do nothing. The action each pin electronics circuit takes during a given test cycle is controlled by the value of input data (a "test vector") supplied thereto at the start of the cycle. A test vector may also include timing data that tells the pin electronics circuit when to carry out the action during the test cycle.

Early IC testers employed a central addressable memory storing a large word at each address, each word being formed by all of the vector data needed for every pin electronics circuit for a particular test cycle. Thus, for example, if an IC had 8 terminals and a tester employed 8-bit vector data words, a 64-bit word was stored at each vector memory address. The vector memory was sequentially addressed so that it read out a next word during each test cycle. The eight vectors contained in the read out word were concurrently distributed to the pin electronics circuits by a large star bus. Thus a vector memory for a test spanning one million test cycles stored one million 64-bit words at successive addresses.

As the size and complexity of IC's increased, so too did the number of terminals on an IC; some IC's now have hundreds of pins. Due to the large number of parallel buses needed to transmit the vectors concurrently to the pin electronics, the use of a centralized vector memory has become impractical. U.S. Pat. No. 4,862,067 issued Aug. 29, 1989 to Brune et al describes a "per pin" integrated circuit tester in which vector storage memory is distributed to the tester nodes. Brune's tester includes a central address generator and a set of tester nodes, one node for each terminal of a device under test (DUT). Each node includes a vector memory for storing a sequence of test vectors, one for each cycle of the test. During a test the central address generator successively increments the address of the test vector memories of all nodes prior to the start of each test cycle so that each test vector memory reads out a new test vector and delivers it to the node's pin electronics at the beginning of each test cycle. In Brune's IC tester, all vector memories are linked to the host computer via a common bus through which the host computer loads vectors into the vector memories before the test. Thus the prior art multiplicity of vector buses leading from a central vector memory to all tester nodes is replaced by a single computer bus linking a host computer to distributed vector memories. While Brune's system reduces the amount of wiring in a tester, it increases the time required to program the tester. Since each vector memory must store one vector for each cycle of the test, the number of vectors that must be distributed to the vector memories can be so enormous that band width limitations on the computer bus greatly limit the speed with which an IC tester can be programmed for a test.

A tester system may reduce the amount of data that must be distributed to the tester nodes by distributing algorithmic instructions for generating vectors instead of the vectors themselves. In such a system, each node includes an instruction processor for generating the vectors during the test based on the locally stored instructions. Integrated circuit testers typically carry out repetitive patterns of actions at various IC terminals at various times during a test. Thus a set of instructions for generating a sequence of vectors including repeating patterns may require less storage space than the sequence of vectors itself. U.S. Pat. No. 4,994,732 issued Feb. 19, 1991 to Jeffery et al describes a per-pin tester which distributes some instruction processing capability to the nodes. In Jeffery's tester, only the first instance of a vector pattern is stored in the vector memory along with a loop instruction indicating the length of the pattern and the number of times a pattern is to be repeated. Each node of a tester includes an instruction processor which sequentially reads vectors out of the vector memory and supplies them to the pin electronics during successive test cycles. When the vector memory controller encounters a loop instruction, it repeats the pattern the indicated number of times. Thus the number of vectors needed to be sent to and stored in a vector memory before a test is reduced.

Signal delay becomes problematic when we employ distributed instruction processors in a large circuit tester. Signal delay is critical when testing an integrated circuit because test activities at all nodes must be precisely coordinated. For example, a test signal sent to an IC input terminal may engender a response in an IC output signal at an IC output terminal. A tester should be able to measure the output signal response at the output terminal at the end of a precisely timed interval following application the test signal to the input terminal. As we increase the complexity of the tester nodes, we also increase the physical size of the nodes and it becomes more difficult to keep all nodes close to the device under test. As the distance between an IC terminal and the tester node that services it increases, so too does the amount of time required for a test or response signal to travel between the IC terminal and the tester node. When testing high speed integrated circuits, this signal travel time becomes a significant portion of the apparent IC response time, thereby complicating tester programming and interpretation of test results.

U.S. Pat. No. 4,517,512 issued May 14, 1985 to Petrich et al describes a test head which holds pin electronics close to the device under tests. In Petrich's test head, a set of circuit cards each containing pin electronics for four IC pins, are arrayed in a radial pattern about a vertical axis of a carrier board. The integrated circuit DUT is mounted on an interface board resting on top of the circular array of pin electronics cards. Test signal input/output terminals at the upper edges of the pin electronics cards connect to the interface board. The interface board delivers test signals from the pin electronics card input/output terminals to the device under test. Petrich's test head is designed to position the pin electronics cards close to the DUT so as to minimize distances between the pin electronics cards and the DUT.

Heat also becomes problematic when we attempt to closely pack distributed instruction processors in a large circuit tester. In Petrich's test head, a duct carries cooling air from a blower to an aperture in the center of the carrier board. The air passes over the pin electronics cards and carries the heat away.

While Petrich's test head brings the pin electronics close to the DUT and keeps the pin electronics cool, the number of pin electronics cards it can accommodate is limited by the allowable diameter of the circular array of pin electronics cards. To increase the number of pin electronics cards, it is necessary to increase the diameter of the circular array, thereby increasing the test signal path distance between the cards and the DUT. One could also increase density by placing pin electronics servicing more than four pins on each pin electronics card. However when pin electronics for only one IC terminal becomes defective, the entire pin electronics card must be replaced, thereby increasing repair costs. Also Petrich's test head does not provide easy access to the pin cards for maintenance and replacement. Finally, when the blower forces air into the test head, that air passes through the head where it is heated and then exits into the room containing the test head. The hot air emanating from the test head can be uncomfortable to operators and maintenance personnel in the vicinity of the test head.

What is needed is a test head structure for holding large numbers of nodes of a per-pin integrated circuit tester close to a device under test while keeping the nodes cool. The test head should provide ready access to pin electronics for maintenance, should cool the nodes without heating the area around the test head, and should require minimal amounts of cabling. The test head should also be highly modular so that system can be sized for the IC being tested and easily expanded.

SUMMARY OF THE INVENTION

A test head for an integrated circuit tester in accordance with the present invention includes a horizontal base holding a printed circuit "grandmother" board. The motherboard distributes input test instructions to an array of carrier boards mounted thereon, the carrier boards being radially distributed about a central vertical axis of the motherboard. Each carrier board holds a set of daughterboards, and each daughterboard holds a set of "node" cards. The carrier boards and daughterboards include data paths for forwarding the test instructions from the motherboard to the node cards. Each node card contains circuits for transmitting test signals to and receiving response signals from a separate terminal of a device under test (DUT) in response to the test instructions forwarded thereto. Edges of the carrier boards extend downward through apertures in the base to contact pads on an interface board holding the DUT. The carrier boards and daughterboards provide conductive paths for the test and response signals extending between the node cards and pads on the DUT interface board. The interface board extends those conductive paths from the pads to terminals of the DUT.

The test head also includes a perforated outer shell and a perforated cylindrical inner plenum about its vertical axis. As a vacuum pump removes warm air from the plenum, cooling air enters the shell from the outside through its perforations, thereby cooling the electronics devices mounted on the node cards. The pump exhausts hot air removed from the plenum away from the test head.

It is accordingly an object of the test head of the present invention to hold large numbers of nodes of a per-pin integrated circuit tester close to a device under test while keeping the nodes cool. The test head also provides ready access to pin electronics for maintenance, cools the nodes without heating the area around the test head, and requires minimal amounts of cabling. The test head is also highly modular so that system can be sized for the IC being tested and easily expanded.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
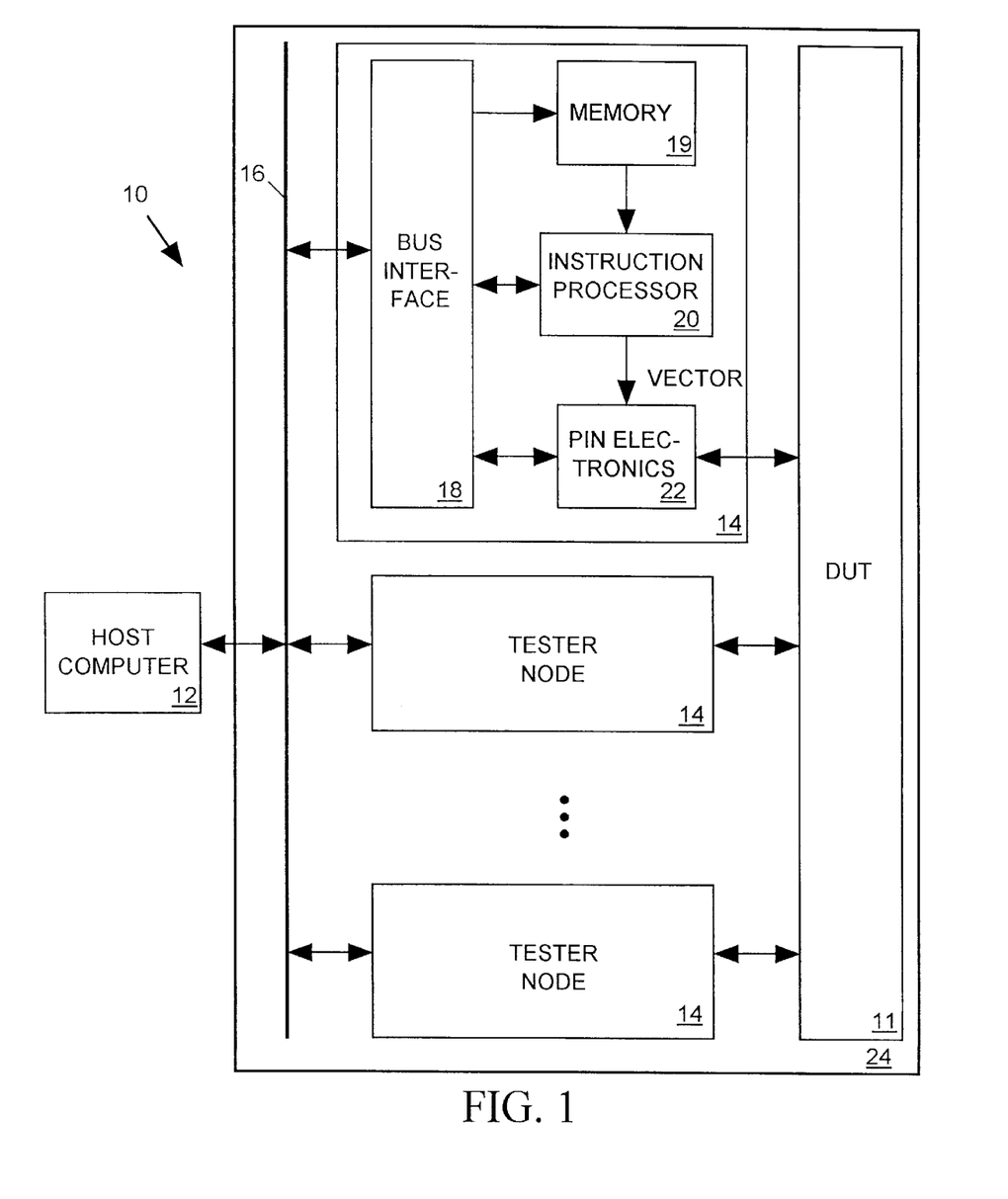
FIG. 1 is an electronic block diagram of a per-pin integrated circuit tester.

FIG. 1 is an electronic block diagram of a per-pin integrated circuit tester 10 for testing an integrated circuit device under test (DUT) 11. Tester 10 includes a host computer 12 connected to a set of tester nodes 14 via a bus 16. Each tester node 14 includes a bus interface circuit 18, a memory 19, an instruction processor 20, and a pin electronics circuit 22. During a test of DUT 11, the pin electronics circuit 22 of each tester node 14 carries out all test activities with respect to a corresponding terminal of DUT 11. For example at various times during a test, a pin electronics circuit 22 may transmit a test signal of a particular logic level to the DUT terminal or may measure an output signal produced by DUT 11 at the DUT terminal and store data indicating the results in internal acquisition memories. The actions of the pin electronics circuit 22 of each node 14 are controlled by an input sequence of data (test vectors) produced by the node's instruction processor 20 in response to a sequence of instructions it reads out of memory 19. Host computer 12 writes the instructions into the memory 19 of each node 14 before the test via bus 16 and bus interface circuit 18. To initiate the test, host computer 12 sends a start signal to all instruction processors via bus 16 and bus interface circuit 18. During the test, each instruction processor 20 reads instructions out of its local memory 19 and executes the instructions to generate vectors supplied to the local pin electronics circuits 22. After the test, host computer 12 reads acquired test data out of acquisition memories within pin electronics circuits 22, also via bus 16 and bus interface circuit 18.

The design and operation of the electronic aspects of an integrated circuit tester of the type illustrated in FIG. 1 is well-known and not further detailed herein. For example, U.S. Pat. No. 4,994,732 issued Feb. 19, 1991 to Jeffery et al, incorporated herein by reference, describes a similar per-pin integrated circuit tester.

The present invention relates primarily to the mechanical structure of a test head 24 on which tester nodes 14 and DUT 11 are mounted. Test head 24 is designed to hold tester nodes 14 close to DUT 11 so that the signal paths between terminals of DUT 11 and pin electronics circuits 22 of tester nodes 14 are short and of uniform length. A tester should be able to measure the output signal response at the output terminal following a precisely timed interval following application a test signal to the input terminal. When testing high speed integrated circuits, excessive signal travel time between the pin electronics circuit 22 and the DUT 11 can become a significant portion of the apparent IC response time and can complicate tester programming and interpretation of test results. Short signal paths minimize the time required for test signals to travel between pin electronics circuit 22 and terminals of DUT 11. Short signal paths are also less susceptible to noise.

Test head 24 is also designed to keep the electronics in tester nodes 14 cool. Since each tester node 14 includes its own memory 19, instruction processor 20 and other circuits, each node 14 radiates heat. When a large tester 10 includes, for example, 1000 tester nodes 14, each radiating, for example, 5–15 watts, the nodes of test head 24 in total radiate 5,000–15,000 watts. DUT's can also generate substantial amounts of heat. Since tester nodes 14 are clustered as close as possible to DUT 11, a lot of heat is generated in a small space. Various structural features of test head 24 as described herein provide for rapid removal of that heat.

Figure 2:
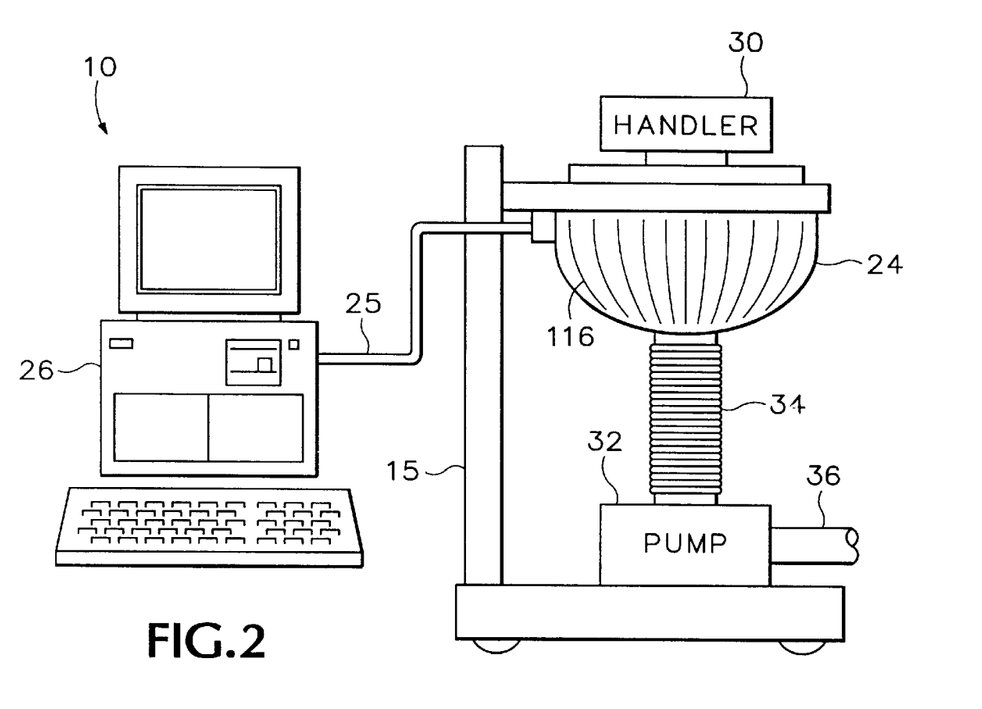
FIG. 2 is a pictorial representation of the integrated circuit tester of FIG. 1.
Figure 3:
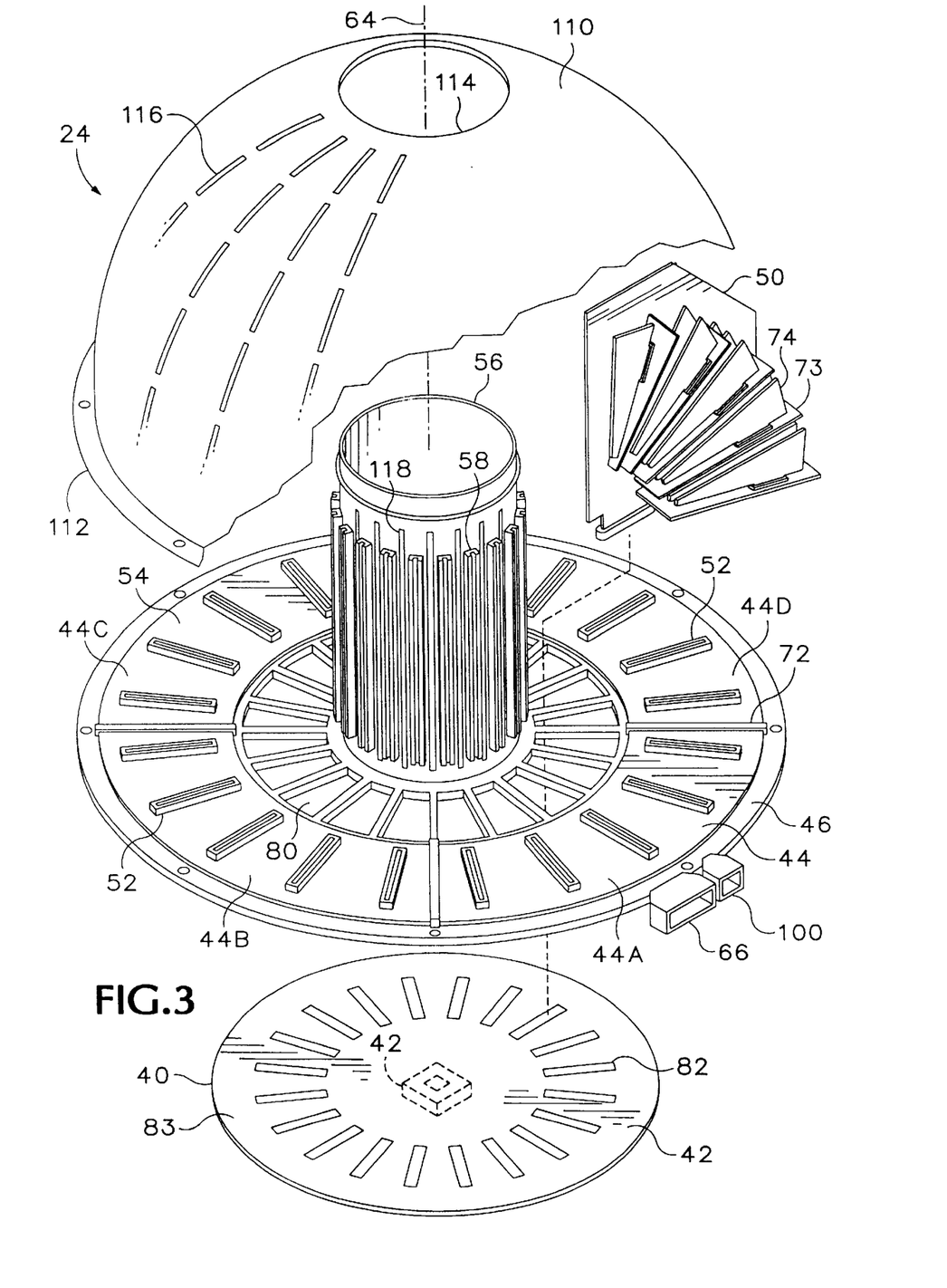
FIG. 3 is an exploded perspective view of the test head of the integrated circuit tester of FIG. 2.
Figure 4:
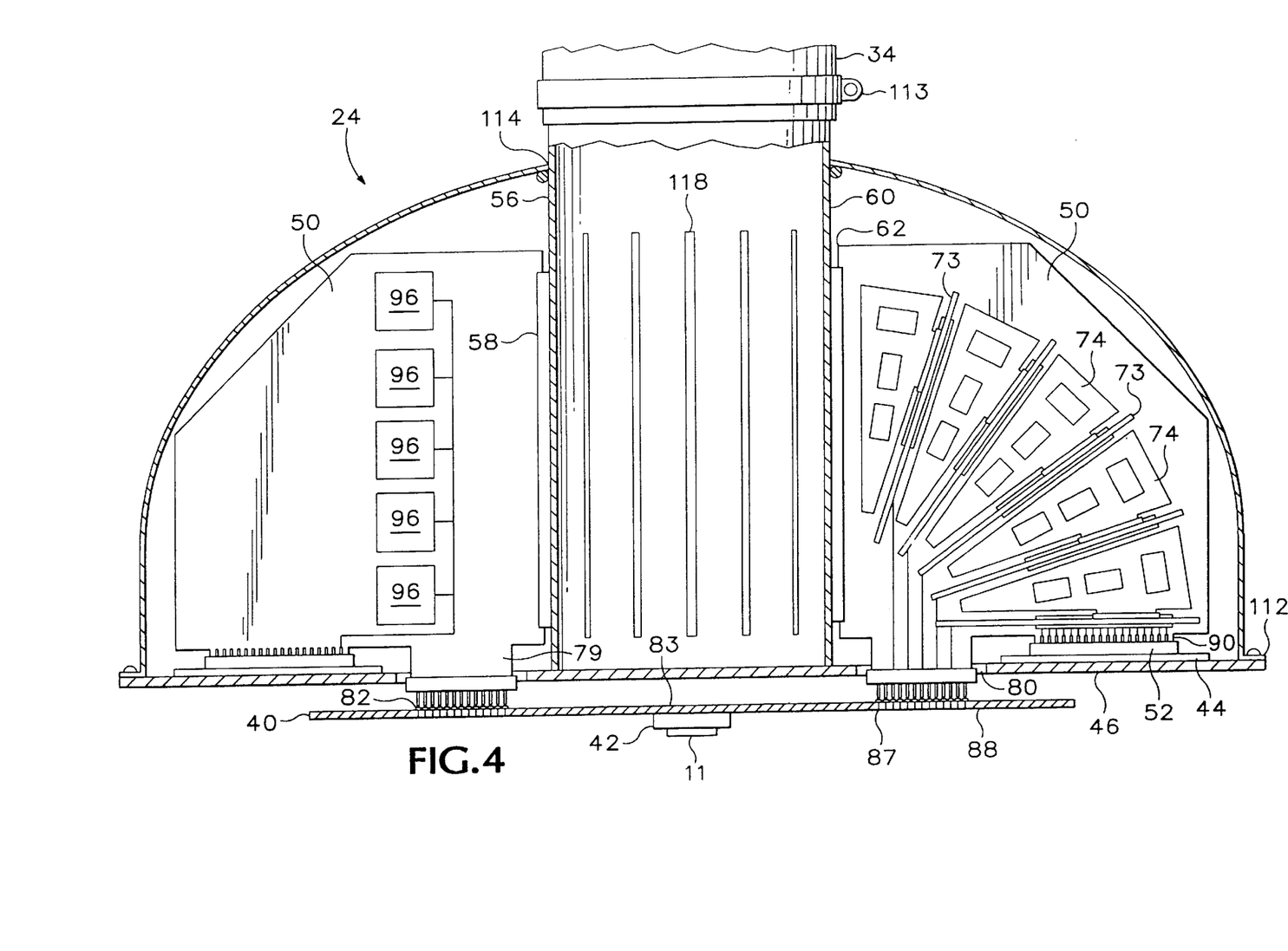
FIG. 4 is a sectional elevation view of the test head of FIG. 2.
Figure 5:
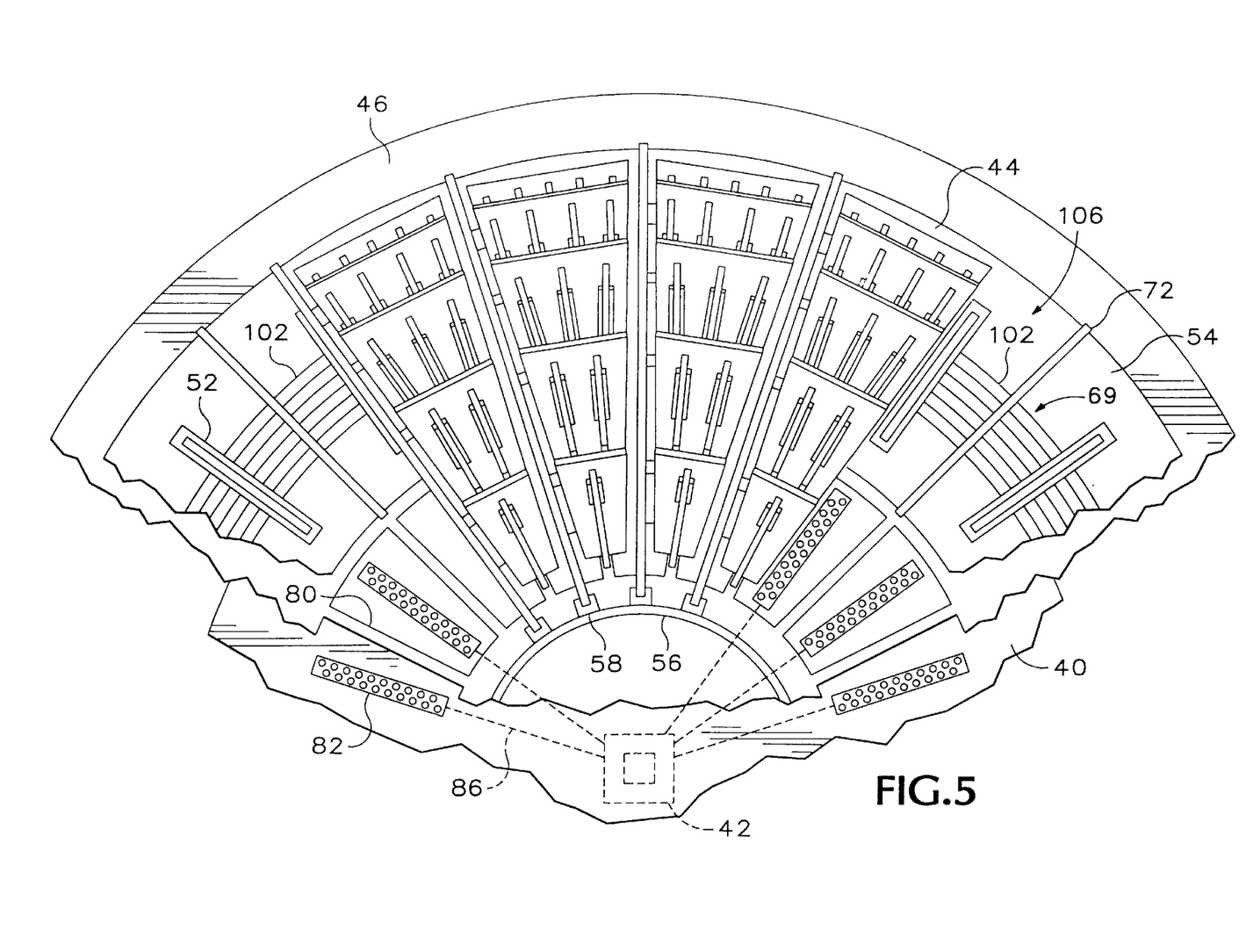
FIG. 5 is a partial sectional plan view of the test head test head of FIG. 2 with the cover removed.
Figures 6, 8, 9:
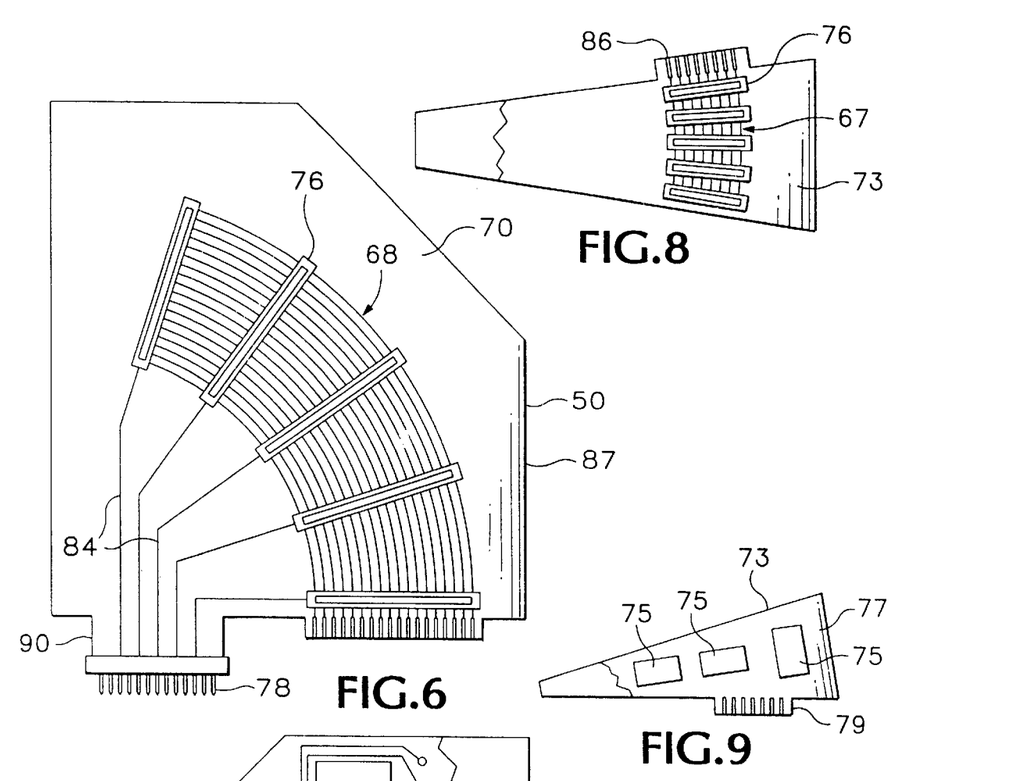
FIG. 6 is an elevation view of a front side of a front side of a carrier board of the test head of FIG. 2.
FIG. 8 is a plan view of an upper surface of a typical daughterboard of the test head of FIG. 2.
FIG. 9 is a plan view of an upper surface of a typical node card of the test head of FIG. 2.
Figure 7:
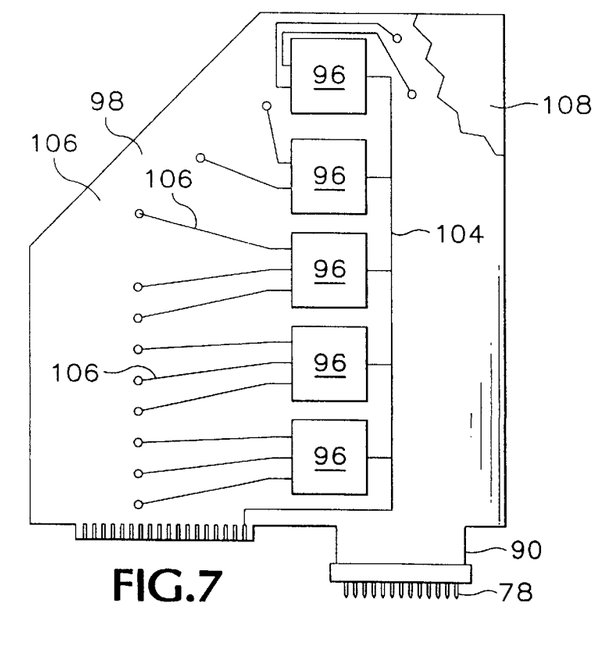
FIG. 7 is an elevation view of a rear side of a carrier board of the test head of FIG. 2.

FIG. 2 is a pictorial representation of the integrated circuit tester 10 of FIG. 1. Computer 12, contained in a console 26, is connected to test head 24 via a cable 25 including bus 16 of FIG. 10 and conductors delivering 48-volt power to test head 24 from a power supply within console 26. A conventional manipulator base 28 supports test head 24 in inverted position under an optional DUT handler 30. Handler 30 allows an operator to manipulate DUT 11 of FIG. 2 into position on the underside of test head 24. A vacuum pump 32 connected to test head 24 via a flexible duct 34 draws warm air from test head 24 and exhausts it away from test head 24 via an exhaust pipe 36.

FIGS. 3–9 illustrate the physical structure of test head 24 for integrated circuit tester 10 in accordance with the present invention. Referring to FIGS. 3–9, test head 24 includes a horizontally disposed interface board 40 for holding a device under test (DUT) 11 in a socket (or probe head) 42. A "grandmother" board 44 is mounted on a base plate 46 positioned immediately above and parallel to DUT interface board 40. Lower edges of a set of carrier boards 50 are inserted into connectors 52 mounted on an upper surface 54 of motherboard 44. A cylindrical support member 56, attached to base plate 46 and extending vertically upward from motherboard 44, includes a set of card holders 58 distributed around its outer surface 60 each for receiving a front edge 62 of a separate carrier board 50. Connectors 52 and holders 58 hold carrier boards 50 in vertical planes perpendicular to the horizontal plane of surface 54 of motherboard 44 with the plane of each carrier board 50 bisecting the vertical axis 64 of cylindrical support member 56.

A connector 66 attached to base plate 46 and motherboard 44 receives cable 25 of FIG. 2 conveying data bus 16 from host computer 12 of FIGS. 1 and 2. A set of microstrip conductors 69 on the planar upper surface 54 of motherboard 44 extend bus 16 from connector 66 to each carrier board connector 52. Motherboard 44 is formed by a set of four board sections 44A–44D mounted on base plate 46 and interconnected by edge connectors 72. Connectors 72 provide path continuity for signals conveyed by microstrip conductors 69 on the surfaces of adjacent board sections 44A–44D. Microstrip conductors 68 on the front surface 70 of each carrier board 50 further extend the data bus arriving on conductors 69 at edge connector 52 to a set of edge connectors 71 mounted on the front surface 70 of each carrier board 50.

A wedge-shaped daughterboard 73 may be installed in each edge connector 71. Each daughterboard 73 includes a set of edge connectors 76 and a set of microstrip conductors 67 for conveying the data bus 16 and other signals from terminals 86 on the edge of daughterboard 73 to each edge connector 76. A wedge-shaped node card 74 may be installed in each edge connector 76. With a node card 74 installed in each edge connector 76, node cards 74 form a substantially dome-shaped three-dimensional array about vertical axis 64. Integrated circuit devices 75 implementing the various components of each tester node 14 of FIG. 1 are mounted on a surface 77 of each node card 74. Each connector 76 connects bus 16 and other signals to terminals 79 of the node card 74 mounted therein. Microstrip conductors (not shown) on the front surface 77 of the node card 74 deliver bus 16 and other signals to terminals of integrated circuits 75 mounted thereon.

A set of pogo pins 78 attached to an extension 90 of the lower edge of each carrier board 50 extend downward through an aperture 80 in base plate 46 to contact conductive pads 82 on an upper surface 83 of DUT interface board 40. Microstrip conductors 84 on front surface 70 of each carrier board 50 provide test signal paths between the pogo pins 78 attached to the extension 90 of carrier board 50 and daughterboard card connectors 71. Microstrip conductors (not shown) on the lower surface 88 of DUT interface board 40 and vias 87 passing through interface board 40 extend the test signal paths from pads 82 to the socket (or probe head) 42 on the underside of DUT interface board 40 containing DUT 11. The socket (or probe head) 42 extends the test signal paths to terminals of DUT 11.

A test signal produced by an integrated circuit 75 implementing the pin electronics circuit 22 (FIG. 1) and mounted on a surface 77 of a node card 74, passes from that integrated circuit, through a connector 76 on a daughterboard 73, through one of conductors 67 to one of daughterboard terminals. The test signal then passes to a connector 71 on a carrier board 50, through a microstrip conductor 84 on the carrier board's surface 70 to a pogo pin 78 and then to a pad 82 on upper surface 83 of DUT interface board 40. The test signal then passes through a via 87 in interface board 40 and through a microstrip conductor (not shown) on the lower surface 88 of DUT interface board 40 to a terminal of socket 42. A DUT 11 output signal follows the same path in the opposite direction from socket 42 back to the integrated circuit 75 on the node card 74. Lengths of microstrip conductors 84 on the carrier boards 50 and microstrip conductors on device interface board 40 are adjusted as necessary to standardize the total length of the signal path between each node card 74 and the DUT 11 terminal it accesses. The hemispherical arrangement of node cards 74 about central axis 64 helps to minimize the standard signal path length.

A set of DC-DC power conversion circuits 96 are mounted on the back surface 98 of each carrier board 50.

Power conversion circuits 96 convert a 48-volt input power signal to lower voltage output power signals for supplying circuit devices 75 mounted on node cards 74. A connector 100 mounted on an edge of base plate 46 and attached to motherboard 44 receives the 48-volt power source from console 26 of FIG. 2 via cable 25 and delivers it to a microstrip conductor 102 on the upper side of motherboard 44. Microstrip conductor 102 delivers the 48-volt power signal to each carrier board connector 52. A microstrip conductor 104 on the back side 98 of each carrier board 50 conveys the 48-volt power signal from connector 52 to power conversion circuits 96. Additional microstrip conductors 106 on back surface 98 of carrier boards 50 convey the lower voltage output power signals produced by conversion circuits 96 to daughterboard connectors 70. Some of conductors 67 on daughterboards 73 convey the power signals to node card connectors 76 which deliver the power signals to node cards 74 mounted therein. Each carrier board 50 includes a ground plane 108 sandwiched between its front surface 70 and it back surface 98 for shielding signal conductors 68 on front surface 70 from the power conversion circuits 96 on back surface 98.

Test head 24 includes a perforated outer shell 110 covering motherboard 44 and carrier boards 50. Shell 110 includes a flange 112 screwed to base plate 46. Shell 110 is suitably constructed of conductive metal to provide an electromagnetic interference shield. Cylindrical support member 56 extends upward through a port 114 of shell 110. Vacuum pump 32 of FIG. 2, connected to support member 56 via flexible duct 34 and clamp 113, pumps warm air out of the interior of cylindrical support member 56. Cool air enters the test head through perforations 116 in shell 110 and passes between node cards 74 to remove heat generated by integrated circuit devices 75 and power conversion circuitry 96 mounted thereon. The heated air then enters cylindrical support member 56 though perforations 118 to be evacuated by vacuum pump 32. Cooling can be augmented by placing test head 24 in a refrigerated room or in a larger container (not shown) into which refrigerated air is forced. The heated air pumped out of test head 24 is suitably exhausted from the room containing test head 24. Test head 24 may be alternatively cooled by pumping air into, rather than out of, support member 56. However since the hot air would exit from perforations 116 in shell 110 and heat the area surrounding test head 24, pumping air out of support member 56 is preferable.

The modular architecture of test head 24 allows it to operate with less than all of its full complement of components. Not every node card connector 76 need hold a node card 74, not every daughterboard connector 71 need hold a daughterboard 73, and not every carrier board connector 52 need hold a carrier board 50. Nor is it necessary that all carrier boards 50 contain the same number of node cards 74. Also test head 24 will operate without a full complement of motherboard 44 sections 44A–44D. Thus test head 24 can be matched in capacity to accommodate the maximum number of terminals of devices to be tested and can be easily expanded in capacity as need dictates by adding motherboard sections, carrier boards, daughterboards and node cards.

Thus has been described a test head structure for holding large numbers of nodes of a per-pin integrated circuit tester close to a device under test while keeping the nodes cool. The test head provides ready access to pin electronics for maintenance, cools the nodes without heating the area around the test head and requires minimal cabling. The test head is also highly modular so that the system can be sized to the IC being tested and easily expanded.

While the forgoing specification has described preferred embodiment(s) of the present invention, one skilled in the art may make many modifications to the preferred embodiment without departing from the invention in its broader aspects. For example, as illustrated embodiment of test head 24, the device interface board 40 may hold a single packaged integrated circuit DUT 11 in a socket 42. It should be understood, however, that device interface board 40 may be customized for each type of device to be tested. For example, device interface board 40 may have several IC sockets 42 for containing several IC devices so that they may be tested concurrently. Such multiple sockets may also be interconnected via traces on the upper surface 83 of device interface board 40 so that several IC's mounted therein may be tested as an interactive circuit. For testing unpackaged ICs, device interface board 40 may include a conventional probe head manipulated by handler 30 of FIG. 2 for contacting pads on the surface of an IC.

The appended claims therefore are intended to cover all such modifications as fall within the true scope and spirit of the invention.

What is claimed is:

1. A test head for an electronic circuit tester of the type having a plurality of tester nodes, each tester node communicating with a device under test (DUT) during a test via a separate test signal, the test head comprising:

a plurality of node cards, each having a first planar surface holding at least one of said tester nodes;

a plurality of daughterboards, each having a second planar surface holding a plurality of said node cards;

a plurality of carrier boards, each having a third planar surface holding a plurality of said daughterboards;

a DUT interface board for holding said DUT, said DUT interface board having a fourth planar surface containing a plurality of contacts and having means for conveying test signals between said DUT and said contact; and means for holding said carrier boards such that each carrier board contacts a separate subset of said contacts.

2. The test head in accordance with claim 1 wherein each carrier board includes means for conveying test signals between the contacts it contacts and the daughterboard cards it holds, and wherein each daughterboard includes means for conveying test signals between the carrier board holding the daughterboard and the node cards it holds.

3. The test head in accordance with claim 1 wherein said node cards form a three-dimensional array.

4. The test head in accordance with claim 1 wherein said means for holding holds each carrier board such that its third planar surface is perpendicular to said fourth planar surface of said DUT interface board.

5. The test head in accordance with claim 4 wherein said means for holding holds said carrier boards such that their third planar surfaces lie in separate planes intersecting at a common axis perpendicular to said fourth planar surface of said DUT interface board.

6. The test head in accordance with claim 4 wherein said daughterboards each have a narrow end positioned nearest said vertical axis and a wider end positioned farthest from said vertical axis.

7. The test head in accordance with claims 6 wherein said node cards each have a narrow end positioned nearest said vertical axis and a wider end positioned farthest from said vertical axis.

8. The test head in accordance with claim 1 wherein said means for holding said carrier boards such that each carrier board contacts a separate subset of said contacts, comprises:

a base plate having parallel fifth and sixth planar surfaces, said fourth planar surface of said DUT interface board being adjacent to said fifth planar surface, said base plate having at least one aperture extending through said fifth and sixth planar surfaces; and a motherboard mounted on said sixth planar surface of said base plate and containing connectors for holding said carrier boards, wherein a portion of each carrier board, when held by one of said connectors, extends through said at least one aperture in said base plate and contacts said subset of said contacts.

9. The test head in accordance with claim 8 further comprising:

a support member having an outer surface and extending from said sixth planar surface of said base plate, and a plurality of card holders mounted on said outer surface of said support member for receiving and holding said carrier boards.

10. The test head in accordance with claim 9 wherein said support member is substantially cylindrical in shape.

11. The test head in accordance with claim 9 further comprising:

an air pump, and means for attaching said air pump to said support member such that said air pump pumps air from an interior of said support member.

12. The test head in accordance with claim 11 wherein said outer surface of said support member is perforated such that when said air pump pumps air from the interior of said support member, air enters said interior through the perforated surface.

13. The test head in accordance with claim 12 further comprising a perforated cover attached to said base plate and covering said carrier boards.

14. A test head for an electronic circuit tester of the type having a plurality of tester nodes, each tester node communicating with a device under test (DUT) during a test via a separate test signal in response to an input set of instructions, the test head comprising:

a plurality of node cards, each having a first planar surface holding at least one of said tester nodes;

a plurality of daughterboards, each having a second planar surface holding a plurality of said node cards;

a plurality of carrier boards, each having a third planar surface holding a plurality of said daughterboards;

a DUT interface board for holding said DUT, said DUT interface board having a fourth planar surface containing a plurality of contacts and having means for conveying test signals between said DUT and said contacts; and a base plate having parallel fifth and sixth planar surfaces, said fourth planar surface of said DUT interface board being adjacent to said fifth planar surface, said base plate having at least one aperture extending through said fifth and sixth planar surfaces; and a motherboard mounted on said sixth planar surface of said base plate, said motherboard holding said carrier boards, wherein a portion of each carrier board, when held by extends through said at least one aperture in said base plate and contacts a subset of said contacts, wherein said motherboard includes means for receiving said input instructions and distributing them to said carrier boards, wherein each carrier board includes means for receiving said input instructions from said motherboard and for distributing them to the daughterboard it holds, wherein each daughterboard includes means for receiving said input instructions from the carrier board holding it and for distributing them to the node cards it holds, and wherein each node card includes means for receiving said input instructions from the daughterboard holding it and for delivering the to the at least one node it holds.

15. The test head in accordance with claim 14 wherein said motherboard comprises:

a plurality of motherboard sections mounted on said base plate, and a plurality of motherboard connectors linking said motherboard sections, said connectors conveying said input instructions between said motherboard sections.

16. The test head in accordance with claim 14 further comprising a set of power conversion circuits each for producing at least one output power signal in response to an input power signal, wherein the input and output power signals have differing voltage levels, each carrier board holding at least one of said power conversion circuits, wherein each carrier board includes means for conveying said at least one output power signal to the daughterboards it holds, and wherein each daughterboard includes means for conveying said at least one of said output power signals to the node cards it holds.

17. The test head in accordance with claim 16 wherein said motherboard includes means for delivering said input power signal to each of said carrier boards, wherein each of said carrier boards includes means for delivering said input power signal from said motherboard to the power conversion circuit mounted thereon.

18. The test head in accordance with claim 14 wherein each carrier board includes a back planar surface parallel to said third planar surface for holding at least one of said power conversion circuits and includes a ground plane between said third planar surface and said back planar surface.

19. A test head for an integrated circuit tester, for responding to input instructions by testing an integrated circuit device under test (DUT) having a plurality of terminals, the apparatus comprising:

a plurality of node cards each containing a tester node for transmitting and receiving test signals in response to the test instructions supplied as input thereto;

a horizontal base plate having a plurality of apertures distributed about a vertical axis;

an interface board positioned below said base plate for holding said DUT and having a plurality of conductors below said apertures for contacting said terminals of said DUT;

a substantially planar motherboard positioned above said base plate;

a plurality of substantially planar carrier boards mounted on said motherboard and held in vertical planes radially arrayed about said central vertical axis, each carrier board having a plurality of first conductive paths, each extending downward through one of said apertures in said base and contacting one of said conductors on said interface;

plurality of substantially planar daughterboards, each carrier board holding a separate subset of said daughterboards, a separate first conductive path of each carrier board extending to each daughterboards it holds, each daughterboard holding a separate subset of said node cards and including second conductive paths extending between the node cards and the first conductive path on the carrier board holding the daughterboard, such that when a node card transmits a test signal it travels to said DUT via one of said first conductive paths and one of said second conductive paths.

20. The test head in accordance with claim 19 wherein the motherboard includes means for receiving said input test instructions and distributing them to said carrier boards, wherein each carrier board includes means for forwarding the test instructions from the motherboard to the daughterboards it holds, and wherein each daughterboard includes means for forwarding the test instructions from the carrier board holding it to the node cards it holds.

21. The test head in accordance with claim 19 wherein said each of said daughterboards has a narrow end positioned nearest said vertical axis and a wider end positioned farthest from said vertical axis.

22. The test head in accordance with claim 19 wherein each of said node cards has a narrow end positioned nearest said vertical axis and a wider end positioned farthest from said vertical axis.

23. The test head in accordance with claim 19 wherein each of said first conductive paths comprises a pogo pin mounted on a lower edge of said carrier board for conducting one of said conductors of said interface board.

24. The test head in accordance with claim 19 further comprising:

a cylindrical support member surrounding said vertical axis and having a perforated surface, a plurality of card connectors mounted on said outer surface of said cylindrical support member for receiving and holding said carrier boards, an air pump, and means for attaching said air pump to said cylindrical support member such that said air pump pumps air from an interior of said cylindrical support member and such that air enters said interior through the perforated surface.

25. The test head in accordance with claim 24 further comprising a perforated cover surrounding said carrier boards.

* * * * *